United States Patent
Schubert et al.

(10) Patent No.: US 6,300,760 B1
(45) Date of Patent: Oct. 9, 2001

(54) ARRANGEMENT FOR COUPLING AN RF-SQUID CIRCUIT TO A SUPER CONDUCTING TANK CIRCUIT

(75) Inventors: Jürgen Schubert, Elsdorf; Yi Zhang, Jülich; Willi Zander, Aldenhoven; Marko Banzet, Geilenkirchen; Huai-ren Yi; Xianghui Zeng, both of Jülich, all of (DE)

(73) Assignee: Forschungszentrum Jülich GmbH, Jülich (DE)

( * ) Notice: Subject to any disclaimer, the term of this patent is extended or adjusted under 35 U.S.C. 154(b) by 0 days.

(21) Appl. No.: 09/308,883
(22) PCT Filed: Nov. 26, 1997
(86) PCT No.: PCT/DE97/02760
  § 371 Date: May 26, 1999
  § 102(e) Date: May 26, 1999
(87) PCT Pub. No.: WO98/23969
  PCT Pub. Date: Jun. 4, 1998

(30) Foreign Application Priority Data

Nov. 28, 1996 (DE) .......................... 296 20 718 U
Apr. 26, 1997 (DE) ............................. 197 17 801
Sep. 4, 1997 (DE) .......................... 297 15 860 U

(51) Int. Cl.$^7$ .......................... G01R 33/035; H01L 39/22
(52) U.S. Cl. .............................................. 324/248; 505/846
(58) Field of Search ...................................... 324/244–248; 505/845, 846–874; 327/527, 528; 257/31

(56) References Cited

FOREIGN PATENT DOCUMENTS 0 441 281    8/1991    (EP) .

OTHER PUBLICATIONS

Zhang Y et al: "Single Layer . . . ", Applied Physics Letters, vol. 65, No. 26, Dec. 26, 1994, pp. 3380–3382.
Zhang Y et al: "High–Sensitivity Microwave . . . ", Superconductor Science and Technology, vol. 7, No. 5, May 1, 1994, pp. 269–272.

Primary Examiner—Jay Patidar
(74) Attorney, Agent, or Firm—Collard & Roe, P.C.

(57) ABSTRACT

In an arrangement for coupling an rf-SQUID to a superconducting tank circuit and to a base plate, in which the tank circuit and the rf-SQUID form a coplanar structure and the tank circuit has a slit, the base plate (10) is configured as an outer loop (10a) coplanar to the rf-SQUID (2) and the tank circuit (1) and has a slit (11), and the tank circuit (1) comprises an inner loop (1a) in which the slit (4) is embodied, whereby the orientation of the slits (4, 11) of the inner loop (1a) and the outer loop (10a) relative to one another determines the resonance frequency $f_r$.

17 Claims, 7 Drawing Sheets

$f_0$ = 1100 MHz $f_0$ = 920 MHz $f_0$ = 803 MHz $f_0$ = 620 MHz

ARRANGEMENT FOR COUPLING AN RF-SQUID CIRCUIT TO A SUPER CONDUCTING TANK CIRCUIT

BACKGROUND OF THE INVENTION

1. Field of the Invention

The present invention relates to an arrangement for coupling an rf-SQUID to a superconducting tank circuit and to a base plate, in which arrangement of the tank circuit and the rf-SQUID form a coplanar structure and the tank circuit has a slit.

2. The Prior Art

Various proposals have been pursued heretofore for coupling rf-SQUID magnetometers to superconducting tank circuits.

One possibility is to employ a lambda resonator, to which an rf-SQUID is coupled galvanically, whereby said rf-SQUID functions at the same time as a flux pickup loop. Such a SQUID magnetometer may have a tank frequency of 3 GHz.

The use of a lambda resonator, however, is problematic in that it has a quality of only a few 100, which represents a quite low quality in view of the fact that qualities of a few 1000 have already been obtained with lambda/2 resonators. Furthermore, the fact that it is necessary in view of the galvanic coupling to take into account also a parameter which is difficult to calculate, namely the high-frequency current distribution, leads to considerable problems as well. The high-frequency current distribution represents a quantity which is not easy to calculate or control by experimentation. Therefore, it is difficult to optimize the SQUID layout.

Another possibility is to produce planar LC-tank circuits from YBaCuO thin layers with high frequency and high quality. Such LC-tank circuits are operated in a flip-chip arrangement, with the rf-SQUID in washer-SQUID structure. The parasitic capacities occurring in this connection between the LC-tank circuit and the rf-SQUID reduce the quality of the LC-tank circuit and make the current distribution in the combined LC-tank circuit/washer-SQUID structure complicated.

The aforementioned arrangement has been described by this applicant in application 196 11 900.6, which is still unpublished. Said arrangement solves the problem of parasitic capacities. However, the problem continues to exist that the coplanar arranged rf-SQUID and tank circuit cannot be arranged in one plane with the base plate, and that the base plate, furthermore, represents a potential noise source that may limit the application of an rf-SQUID magnetometer.

SUMMARY OF THE INVENTION

Therefore, the problem of the present invention is to create an arrangement which eliminates the aforementioned problems when an rf-SQUID magnetometer is coupled to a superconducting tank circuit.

The problem is solved by providing a base configured as an outer loop which is coplanar to the rf-SQUID and to the tank circuit, and that it has a slit; and that the tank circuit has an inner loop in which the slit is embodied; and that the orientation of the slits of the inner loop and the outer loop relative to one another determines the resonance frequency $f_r$.

The arrangement as defined by the invention relates to the possibility of advantageous, optimal coupling of an rf-SQUID to a tank circuit and to a base plate without the drawbacks outlined above. With the fully integrated arrangement comprising the rf-SQUID, the tank circuit and the base plate, and with the configuration or orientation of the slits in the rf-SQUID and in the base plate, it is possible to adjust the frequency of the tank circuit in a simple way depending on the geometry, which, therefore, offers an important advantage, for example when structuring a multi-channel SQUID system for medical applications. Furthermore, noise conditioned by the base plate can be suppressed.

In addition, the fully integrated arrangement permits simple estimation of the coupling between the rf-SQUID and the tank circuit.

It is advantageous that an adjustment of the slits relative to one another effects a change in the resonance frequency $f_r$ 300 ≦ MHz.

A further advantage is that a defined superconducting short-circuit is built-in between the rf-SQUID and the tank circuit because the resonance frequency of the resonance circuit increases with the decrease in dimension. Above a limit frequency of 1 GHz, however, the required SQUID electronics becomes very expensive and requires much expenditure. The resonance frequency is distinctly reduced by the defined superconducting short-circuit, so that it is possible in a very simple way to obtain through a simple change in the geometry discrete frequency ranges within a span of 600 MHz, and still resonance frequencies of up to 500 MHz with very small dimensions. Such discrete frequencies are a required precondition for realizing a multi-channel HTSL-SQUID system.

It is advantageous that a flow transformer is integrated in the arrangement in order to raise the magnetic field sensitivity of an rf-SQUID even further.

A further advantage consists on that the flow transformer comprises a coupling coil, which forms of current takes place, which exist in such an arrangement is short-circuited. Thereby, decoupling of two forms of current takes place, which exist in such an arrangement. The two types of current differ from each other with respect to their high and low frequencies. The parasitic contributions of the high-frequency current, which develop on the crossovers of the flow transformer, disappear due to the decoupling. In the decoupled state, only low-frequency current flows via the crossovers.

It is particularly advantageous if the short-circuit takes place on a defined position of the capacitor.

A further advantage consists in that the field direction of the insert loop opposes the field direction of the coupling coil. This amplifies the SQUID signal in this geometry.

BRIEF DESCRIPTION OF THE DRAWINGS

Other objects and features of the present invention will become apparent from the following detailed description considered in connection with the accompanying drawings. It is to be understood, however, that the drawings are designed as an illustration only and not as a definition of the limits of the invention.

FIG. 2 is a diagram of a test measurement with a geometry according to FIG. 1a.

DETAILED DESCRIPTION OF THE PREFERRED EMBODIMENT

Figure 4A:
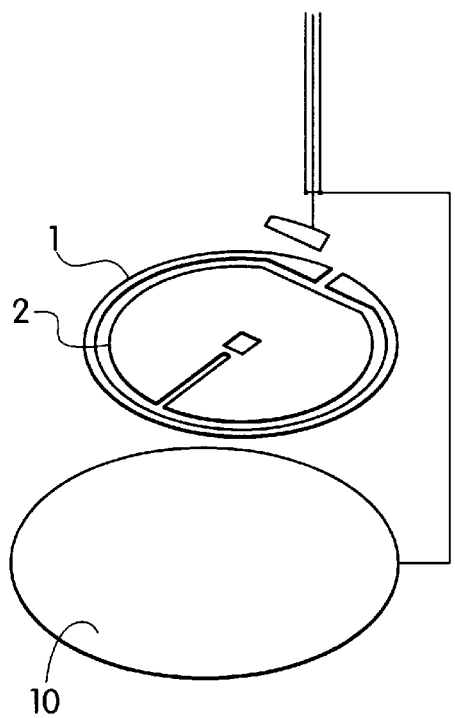
FIGS. 4a and 4b show basic representations of an rf-SQUID with a planar tank circuit and a base plate.
Figure 4B:
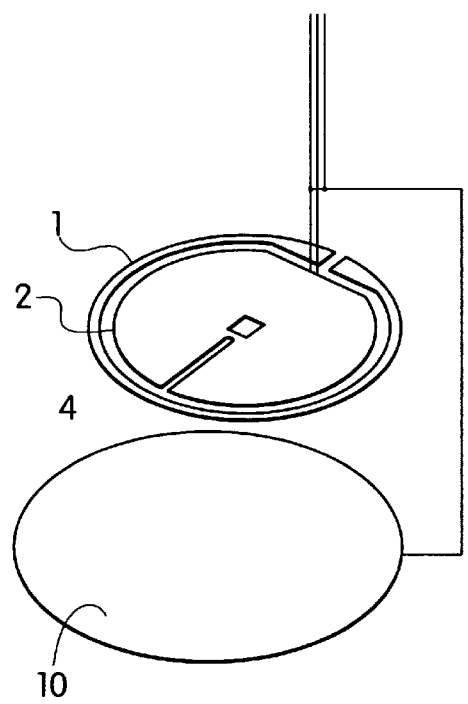
Figure 5:
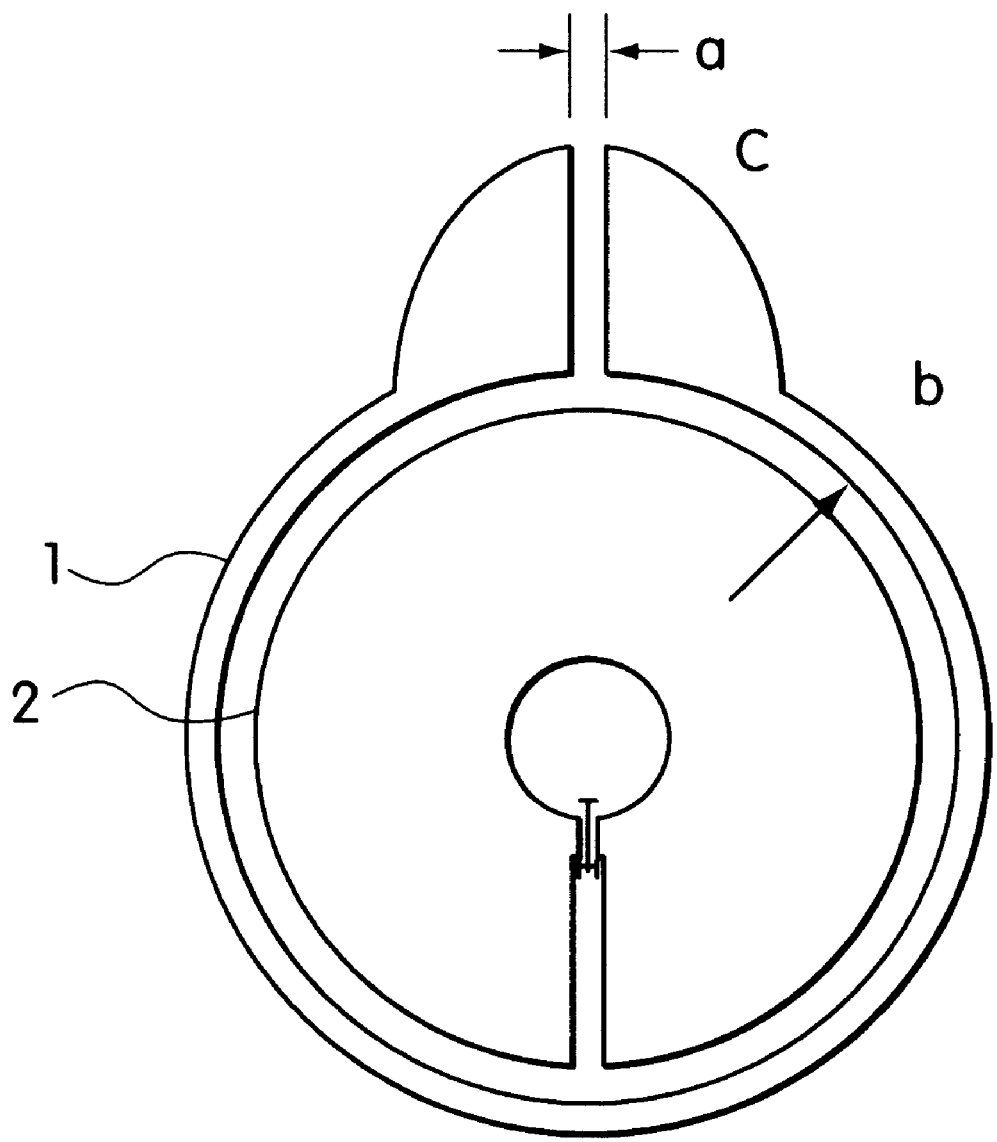
FIG. 5 is a schematic top view of an rf-SQUID and a tank circuit without a coplanar base plate.

FIGS. 4a and 4b each show a tank circuit 1 and an rf-SQUID magnetometer 2 with planar oscillating circuits and lambda/2 or lambda resonators, which are coupled to a base plate 10 made of metal or superconducting material. The consequence thereof is that tank circuit 1 with integrated SQUID 2 and the base plate 10 cannot be arranged in one plane. Furthermore, base plate 10 represents a potential noise source which may limit the application of an rf-SQUID magnetometer 2. FIG. 5 shows a tank circuit 1 with a coplanar arranged rf-SQUID magnetometer 2 without base plate 10.

Figure 1C:
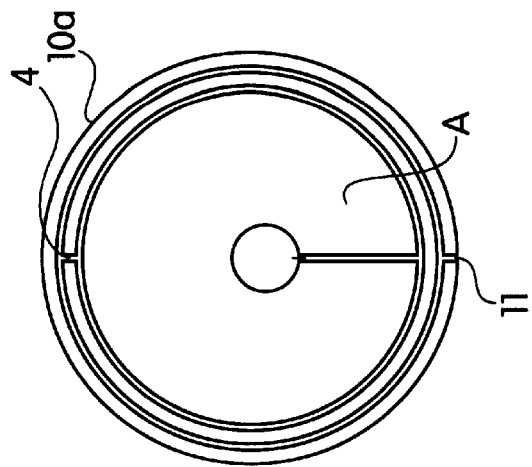
FIG. 1c is a schematic view of a third geometry of a SQUID magnetometer with a base plate configured as a coplanar loop according to the first embodiment of the present invention.
Figure 1B:
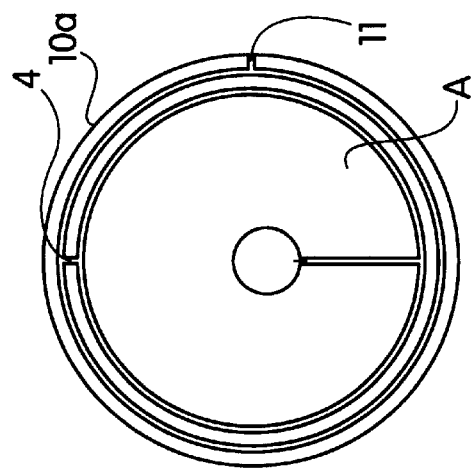
FIG. 1b is a schematic view of a second geometry of a SQUID magnetometer with a base plate configured as a coplanar loop according to the first embodiment of the present invention.
Figure 1A:
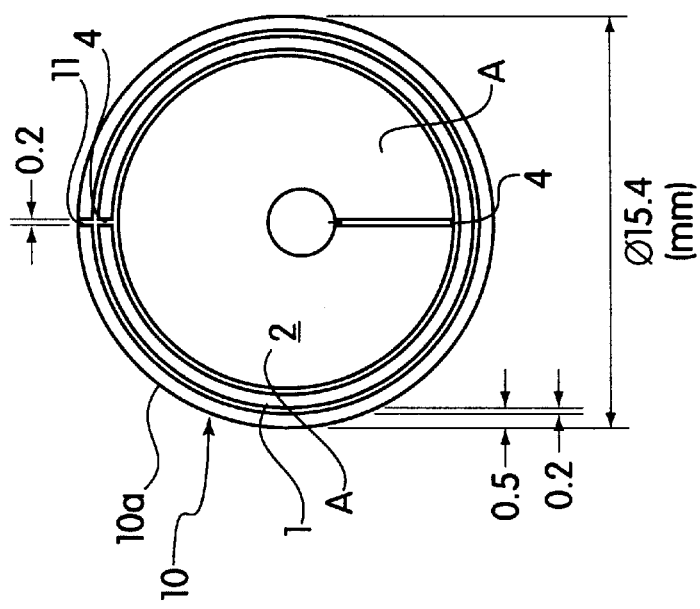
FIG. 1a is a schematic view of a first geometry of a SQUID magnetometer with a base plate configured as a coplanar loop according to the first embodiment of the present invention.

FIGS. 1a to 1c schematically show a first embodiment of an arrangement as defined by the invention, where the base plate 10 is configured as a coplanar arrangement in the form of an outer loop 10a. It is possible in this way to arrange tank circuit 1, SQUID 2 and base plate 10 in one plane.

FIGS. 1a, 1b and 1c each show a different geometry of a SQUID magnetometer 2, which is present with a coplanar arrangement of an inner loop 1a of tank circuit 1 and the outer loop 10a of base plate 10 as the rf-oscillating circuit. An additional outer superconducting loop 10a is added to the SQUID-geometry in FIGS. 4a and 4b. Said loop 10a with a slit 11 represents the coplanar oscillating circuit. The surface A in FIGS. 1a, 1b, 1c may be designed as washer, multiloop- or current injection-SQUID structure. Furthermore, it is possible to employ said surface as a flux concentrator or flux transformer in order to combine the coplanar oscillating circuit with a washer-SQUID magnetometer in flip-chip geometry.

A great advantage of said coplanar oscillating circuit 10a is the geometry-dependent resonance frequency of the oscillating circuit. The only difference between the geometries in FIGS. 1a to 1c is the orientation of slit 11 in the outer loop relative to slit 4 in inner loop $a$. In FIG. 1a, the two slits 4, 11 are aligned one on top of the other, with the difference in orientation amounting to 0 degrees and, respectively, 360 degrees. The resonance frequency amounts to $f_r$=850 MHz. If the orientation is changed to 180 degrees (FIG. 1c), the resonance frequency is reduced to $f_r$=550 MHz. At 90 degrees (FIG. 1b), the resonance frequency is $f_r$=650 MHz. This results in a very simple possibility of obtaining discrete frequency ranges within a span of 300 MHz by simply changing the geometry. Such discrete frequencies are a necessary prerequisite for realizing a multichannel HTSL SQUID system.

A change in the tank frequency of the rf-SQUID 2 is achieved through the simple change in the geometry of the coplanar oscillating circuit 10a. This is a significant advantage versus the prior art especially in view of the structure of a multichannel SQUID system, for example for medical applications.

Figure 2:
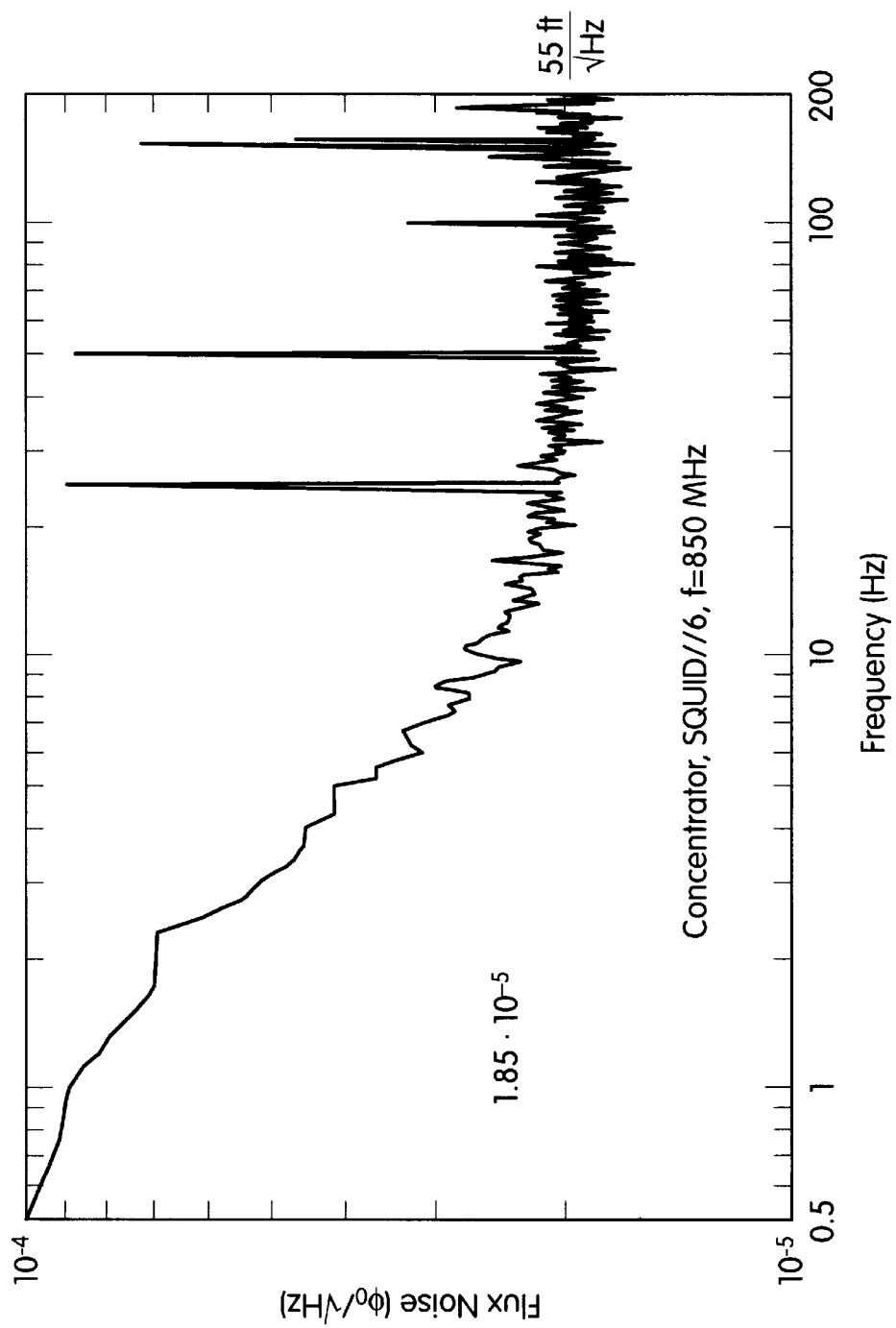

Test measurements with said layout are shown in FIG. 2. At a resonance frequency of the tank circuit of 850 MHz, said test measurements showed a quality of about 500 and white noise of $1.85*10^{-5}\Phi_o/\sqrt{Hz}$.

Figure 3A:
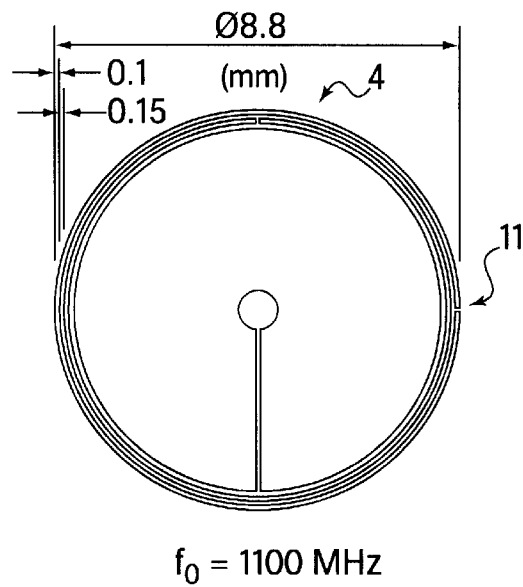
FIG. 3a is a schematic view of a SQUID magnetometer without built-in short-circuit.
Figure 3B:
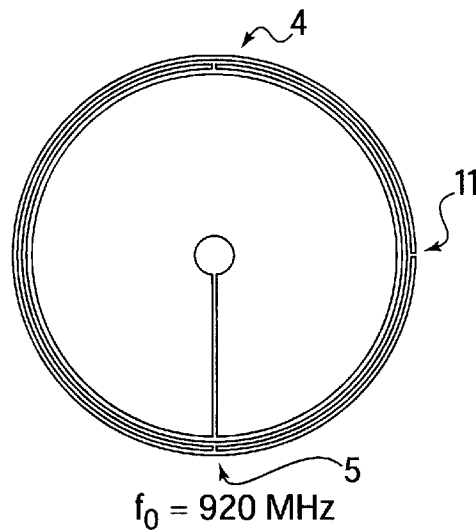
FIG. 3b is a schematic view of a SQUID magnetometer according to a second embodiment of the present invention, with built-in short-circuit and with a first geometry.
Figure 3C:
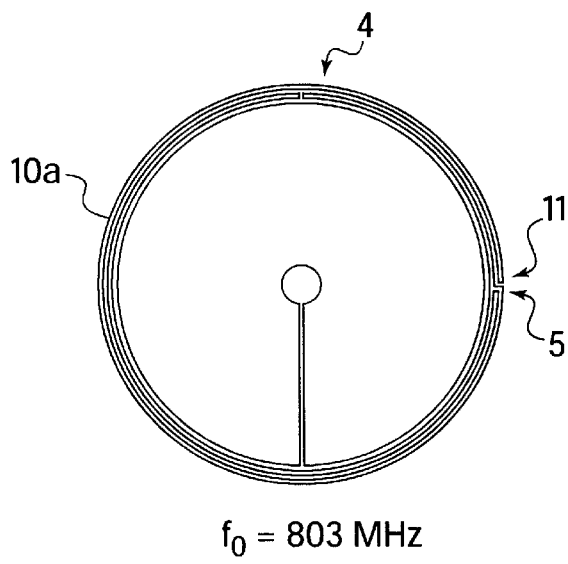
FIG. 3c is a schematic view of a SQUID magnetometer according to a second embodiment of the present invention, with a built-in short-circuit and with a second geometry.
Figure 3D:
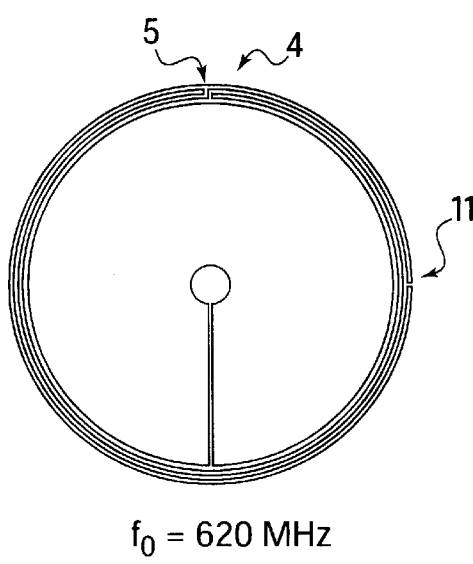
FIG. 3d is a schematic view of a SQUID magnetometer according to a second embodiment, with a built-in short-circuit and with a third geometry.

FIGS. 3b to 3d show the geometry of a coplanar resonance oscillating circuit according to a second embodiment of the present invention, with a defined superconducting short-circuit 5. In FIG. 3a, the resonance circuit is shown without said short-circuit 5. The frequency in FIG. 3a amounts to $f_0$=1.1 GHz at a quality of $Q \geq 5000$. Defined superconducting short-circuits 5 are built-in in FIGS. 3b to 3d. Said short-circuits 5 are attached at 180 degrees (FIG. 3b), 90 degrees (FIG. 3c) and 360 degrees (FIG. 3d). The changes in the resonance frequency in FIGS. 3b to 3d with short-circuits 5 are substantial versus the resonance frequency without short-circuit. In FIG. 3b, the resonance frequency amounts to $f_1$=920 MHz, in FIG. 3c, the resonance frequency amounts to $f_2$=803 MHZ, and in FIG. 3d, the resonance frequency comes to $f_3$=620 MHz. With all oscillating circuits produced, the quality continued to be better than $Q \geq 5000$. Since the quality determines the coupling between the SQUID function and the oscillating circuit, the SQUID function continued to remain unimpaired by the improvement introduced here.

This offers the very simple possibility of obtaining discrete frequency ranges within a span of 600 MHz through simple change of the geometry. Resonance frequencies of up to 500 MHz are realizable with the invention even with substrate dimensions of 10×10 mm².

Figure 6:
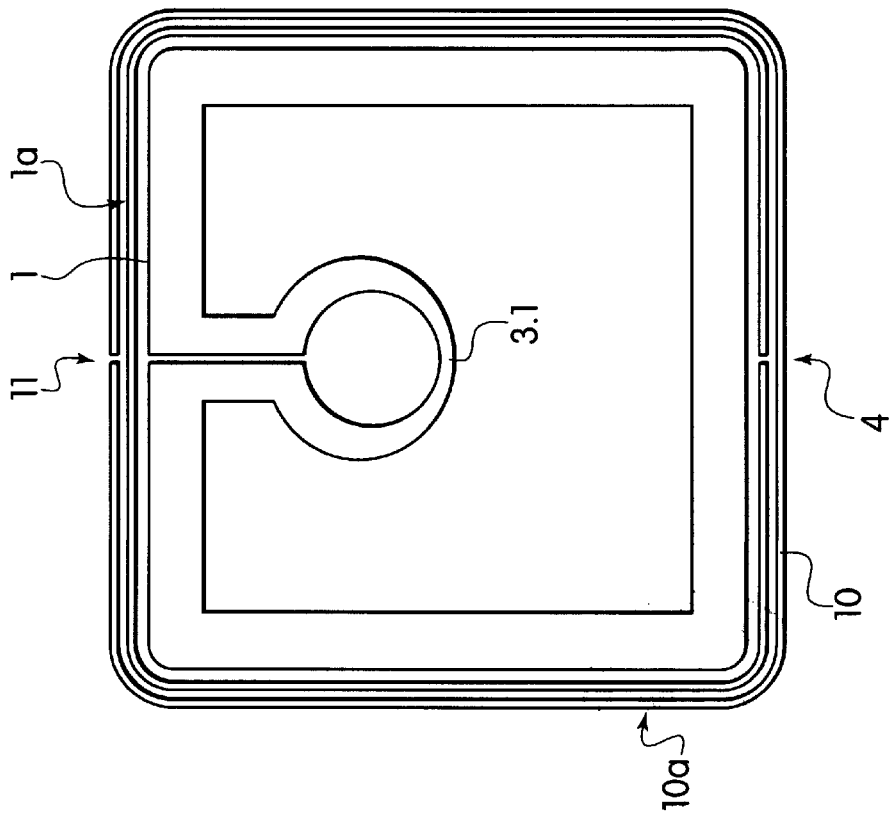
FIG. 6 is a schematic top view of a single-layer flux transformer with a base plate configured as a coplanar loop according to the present invention.
Figure 9:
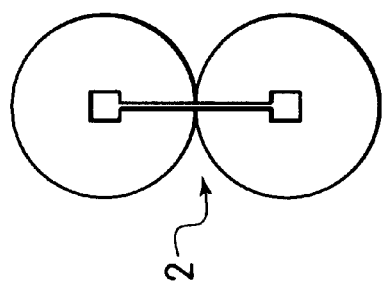
FIG. 9 is a schematic top view of a gradiometer SQUID or two-hole SQUID.

Another embodiment of an arrangement as defined by the invention is schematically shown in FIG. 6, where the base plate 10 is configured as a coplanar arrangement in the form of an outer loop 10a and the tank circuit 1 and the base plate 10 are arranged in one plane. A flux transformer with an insert loop 3.1 is arranged within tank circuit 1. A gradiometer-SQUID 2 or two-hole SQUID (FIG. 9) is inserted in such a way that the Josephson contact is positioned at the point of contact of the two washer surfaces. Said SQUID 2 is applied to the flux transformer in a flip-chip arrangement.

Figure 7:
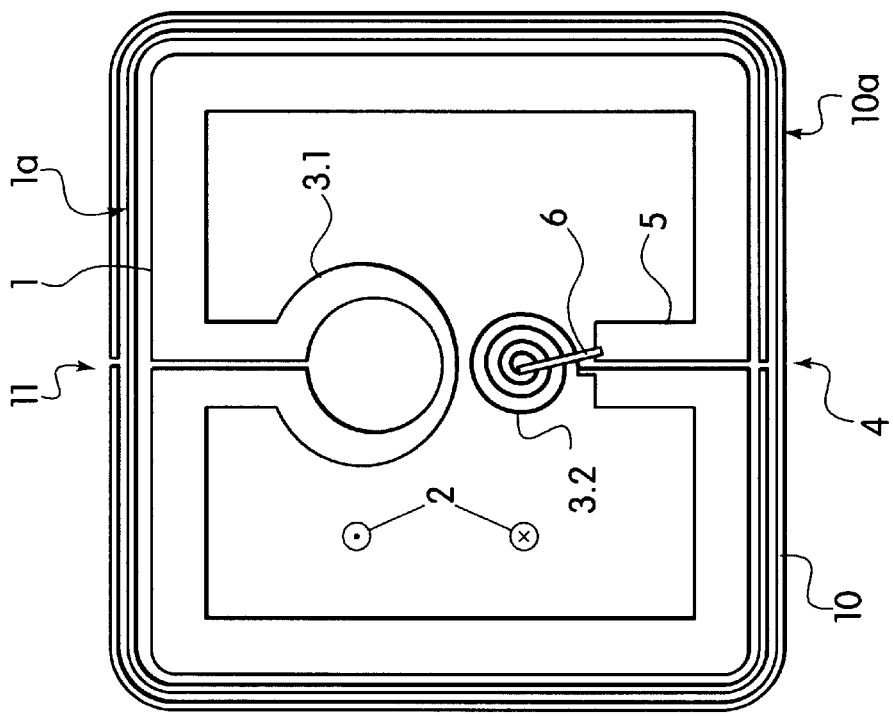
FIG. 7 is a schematic view of a single-layer flux transformer with a base plate configured as a coplanar loop, and with a multilayer flux transformer according to the present invention.

In FIG. 7, provision is made for a flux transformer within tank circuit 1, said flux transformer comprising a multilayer coupling coil 3.2. Furthermore, the multilayer coupling coil 3.2 has a crossover 6.

Figure 8:
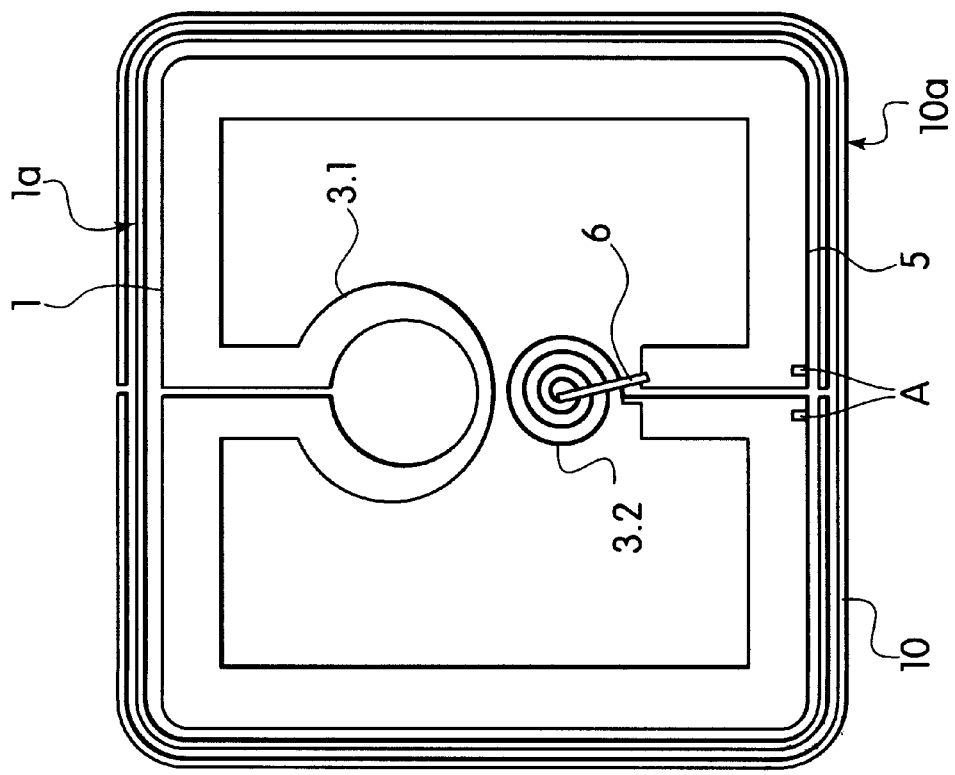
FIG. 8 is a schematic view of a single-layer flux transformer with a base plate configured as a coplanar loop and with a multilayered flow transformer with short-circuit according to the present invention.

Due to the fact that a high-frequency type of current and a low-frequency type of current are present in the arrangement of the invention, and that the high-frequency current has a parasitic effect on crossovers 6 of the flux transformer, and that, furthermore, the quality of the oscillating circuit is reduced by the high-frequency current at a tank frequency of about 900 MHz, provision is made in a position A (FIG. 8) for short-circuits 5 on a capacitor 7, such short-circuits decoupling the two types of current, so that in the decoupled state, only low-frequency currents will still flow via crossovers 6. The short-circuits are normal-conducting high-frequency metal short-circuits. The second superconducting loop 10a serves for high-frequency coupling between SQUID 2 and the flux transformer. The high-frequency current is acting here and provides for decoupling between SQUID 2 and tank circuit 1. Due to the fact that the field direction of insert loop 3.1 and the field direction of multi-layered loop 3.2 exactly oppose one another, the SQUID-signal is amplified in this geometry. Accordingly, while only a few embodiments of the present invention has been shown and described, it is obvious that many changes and modifaications may be made thereunto without departing from the spirit and scopeof the invention.

What is claimed is:

1. An arrangement for coupling an rf-SQUID to a superconducting tank circuit and to a base plate, in which the tank circuit and the rf-SQUID form a coplanar structure and the tank circuit has a slit, characterized in that the base plate is configured as an outer loop (10a) coplanar to the rf-SQUID (2) and to the tank circuit (1) and has a slit (11), and that the tank circuit (1) comprises an inner loop (1a) in which the slit (4) is embodied, and that the orientation of the slits (4, 11) of the inner loop (1a) and the outer loop (10a) relative to one another determines the resonance frequency $f_r$.

2. The arrangement according to claim 1, characterized in that an adjustment of the slits (4, 11) effects a change of the resonance frequency $f_r$ of less than 300 MHz.

3. The arrangement according to claim 1, characterized in that a defined superconducting short-circuit (5) is built-in between the rf-SQUID (2) and the tank circuit (1).

4. The arrangement according to claim 3, characterized in that the defined superconducting short-circuit (5) is built-in between the inner loop (1a) and the outer loop (10a).

5. The arrangement according to claim 3, characterized in that the orientation of the short-circuit (5) relative to the slit (4) of the inner loop (1a) determines the resonance frequency $f_r$.

6. The arrangement according to claim 3, characterized in that the installation of the defined super-conducting short-circuit (5) effects a change of the resonance frequency $f_r$ of less than 600 MHz.

7. The arrangement according to claim 1, characterized in that the rf-SQUID (2) has a SQUID with washer-SQUID structure.

8. The arrangement according to claim 1, characterized in that the rf-SQUID (2) has a SQUID with multiloop-SQUID structure.

9. The arrangement according to claim 1, characterized in that the rf-SQUID (2) has a SQUID with current injection-SQUID structure.

10. The arrangement according to claim 1, characterized in that the rf-SQUID (2) has a SQUID with single-layer or multilayered transformers with a plurality of windings.

11. The arrangement according to claim 1, characterized in that the rf-SQUID (2) has a SQUID with a double-coil gradiometer.

12. The arrangement according to claim 11, characterized in that the double-coil gradiometer is designed with two coils connected opposing in series.

13. The arrangement according to claim 1, characterized in that a flux transformer is formed within the tank circuit (1), said flux transformer having the coplanar outer loop (2), an insert loop (3.1) and a capacitor (7).

14. The arrangement according to claim 13, characterized in that provision is made for a second coupling coil (3.2) with a crossover (6), said coil being short-circuited.

15. The arrangement according to claim 14, characterized in that the short-circuit takes place in a position A of the capacitor (7) in order to decouple high-frequency current.

16. The arrangement according to claim 13, characterized in that a field direction of the insert loop (3.1) opposes the field direction of a second coupling coil (3.2).

17. The arrangement according to claim 1, characterized in that the tank circuit (1) has dimensions of less than 10×10 mm$^2$.

* * * * *